United States Patent
Hu et al.

(10) Patent No.: US 10,996,523 B2
(45) Date of Patent: May 4, 2021

(54) DISPLAY DEVICE HAVING AN ANTENNA COIL

(71) Applicant: AU OPTRONICS CORPORATION, Hsin-Chu (TW)

(72) Inventors: Chia-Hua Hu, Hsin-Chu (TW); Chi-Hung Lu, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 16/796,328

(22) Filed: Feb. 20, 2020

(65) Prior Publication Data

US 2020/0292889 A1 Sep. 17, 2020

(30) Foreign Application Priority Data

Mar. 15, 2019 (TW) .................................. 108108901

(51) Int. Cl.
| | | |
|---|---|---|
| *G02F 1/1343* | (2006.01) | |
| *G02F 1/1362* | (2006.01) | |
| *H01L 27/13* | (2006.01) | |
| *H01Q 7/00* | (2006.01) | |
| *G02F 1/1368* | (2006.01) | |

(52) U.S. Cl.
CPC .. *G02F 1/134309* (2013.01); *G02F 1/136286* (2013.01); *H01L 27/13* (2013.01); *H01Q 7/00* (2013.01); *G02F 1/1368* (2013.01); *G02F 1/134318* (2021.01)

(58) Field of Classification Search
CPC combination set(s) only.
See application file for complete search history.

(56) References Cited

U.S. PATENT DOCUMENTS

| | | | |
|---|---|---|---|
| 8,400,365 B2 | 3/2013 | Kato et al. | |
| 2005/0128409 A1* | 6/2005 | Lee ................... | G02F 1/134363 349/141 |
| 2015/0331297 A1* | 11/2015 | Han ......................... | G02B 5/30 359/9 |

FOREIGN PATENT DOCUMENTS

| | | |
|---|---|---|
| CN | 102576929 B | 1/2015 |
| CN | 109102759 | 11/2019 |

OTHER PUBLICATIONS

Taiwan Patent Office "Office Action" dated Feb. 20, 2020, Taiwan.

* cited by examiner

*Primary Examiner* — Lauren Nguyen
(74) *Attorney, Agent, or Firm* — WPAT, PC

(57) ABSTRACT

A display device is provided. The display device includes a display module and an antenna coil. The display panel has a first substrate, a second substrate, a common electrode layer, a TFT layer and a light modulating layer. The common electrode layer is disposed between the first substrate and the second substrate. The antenna coil is disposed on the side of the first substrate or the second substrate facing away from the light modulating layer. The orthogonal projection of the antenna coil on the light common electrode defines a contour of the antenna coil, wherein the common electrode layer is discontinuous along at least one part of the contour.

7 Claims, 8 Drawing Sheets

DISPLAY DEVICE HAVING AN ANTENNA COIL

BACKGROUND OF THE INVENTION

1. Field of the Invention

The present disclosure relates to a display device; in particular, it relates to a display device including an antenna.

2. Description of the Prior Art

Along with the continuous development of various network technologies, external communication using electron devices has also been progressing. Depending on the purpose of use, various ways of transmission are available in terms of speed, distance, and power consumption. To achieve the purpose of wireless transmission, it is indispensable to dispose an antenna in the electron device. However, taking into account issues such as signal transmission and interferance, how an antenna should be disposed is often the key point of design.

Taking the recently widely-used technology of near field communication as an example, current technology provides a technical method to integrate a near field antenna in the panel, wherein an antenna coil is disposed on the back side of the panel. However, for a thin film transistor liquid crystal display, which currently predominates the market, since near field communication works in a magnetic field with high frequency(13.56 MHz), where a thin film transistor can easily turn into a conductor, the gate line, the data line, and the thin film transistor in the panel become a circuit of induced current, resulting in induced current in the area of the panel corresponding to the antenna coil when magnetic flux in the antenna coil changes. In addition, a common electrode (Vcom) is a conductor, therefore an induced current may also be generated. An induced current will increase the resistance of the antenna coil, resulting in weaker signals emitted by antennas in near fields, and further affecting the antenna's reception of the induced voltage.

SUMMARY OF THE INVENTION

Therefore, the present disclosure provides a display device to inhibit the influence of the induced current on the antenna signal reception and transmission by changing the pathway of the induction coil.

An embodiment of the present disclosure provides a display device, including a display module and an antenna coil. The display module includes a first substrate, a second substrate, a common electrode layer, a TFT (Thin Film Transistor) layer and a light modulating layer. The common electrode layer is disposed between the first substrate and the second substrate. The TFT layer (the pixel electrode layer) is disposed on the second substrate. The light modulating layer is disposed between the first substrate and the second substrate.

An antenna coil is disposed on the side of the first substrate or the second substrate away from the light modulating layer. An orthogonal projection of the antenna coil on the common electrode layer defines a contour. The common electrode layer is discontinuous along at least one portion of the contour.

For further understanding the features and technology of the present disclosure, please refer to the following detailed descriptions and FIGs about the present disclosure. However, the provided FIGs are merely used for reference and description, and not intended to limit the scope of the present disclosure.

BRIEF DESCRIPTION OF THE DRAWINGS

FIG. 10B and FIG. 100 are diagrams of comparative embodiments of FIG. 10A.

DETAILED DESCRIPTION OF THE PREFERRED EMBODIMENT

Figure 1:
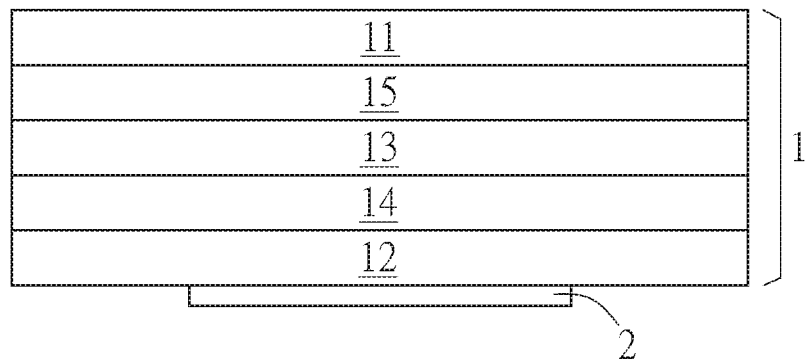
FIG. 1 is a diagram of the display device in the first embodiment of the present disclosure.

The modes of the display device disclosed by the present invention are described by the specific embodiments in FIG. 1 to FIG. 11B. Those who are skilled in the art may understand the advantages and effects of the present disclosure through the contents disclosed in the present specification. However, the contents disclosed as follows are not intended to limit the scope of the present disclosure. Without departing from the conception principles of the present invention, those who are skilled in the art may realize the present disclosure through other embodiments based on different views and applications.

In the attached FIGs, for the purpose of clarification, the thicknesses of layers, films, panels, regions and the like are amplified. In the whole specification, the same marks represent the same element. It should be understood that, when an element such as a layer, a film, a panel, a region or a substrate are described as "being on" or "being connected to" another element, they may be directly on or connected to another element, or there may be other elements therebetween. On the other hand, when an element is described as "directly existing on" another element or "being directly connected to" another element, there is no element therebetween. As used in the present specification, a "connection" may be a physical and/or electrical connection. In addition, an "electrical connection" or "coupling" means that other elements may exist therebetween.

In addition, it should be noted that, even though the terms such as "first", "second", "third" may be used to describe an element, a part, a region, a layer and/or a portion in the present specification, but these elements, parts, regions, layers and/or portions are not limited by such terms. Such terms are merely used to differentiate an element, a part, a region, a layer and/or a portion from another element, part, region, layer and/or portion. Therefore, in the following discussions, a first element, portion, region, layer or portion may be called a second element, portion, region, layer or portion, and do not depart from the teaching of the present disclosure.

The First Embodiment

A display device Z in the first embodiment of the present disclosure is described in FIG. 1 to FIG. 9 as follows. First, please refer to FIG. 1 and FIG. 2. The first embodiment of the present disclosure provides a display device Z, including a display module 1 and an antenna coil 2. The display module 1 has a first substrate 11, a second substrate 12, a common electrode layer 13, a TFT layer 14, and a light modulating layer 15. In the present embodiment, the display module 1 is a liquid crystal panel, and the light modulating layer 15 is a liquid crystal layer; however, the present disclosure is not limited thereto. The antenna coil 2 is disposed on the first substrate 11 or the second substrate 12, and located at the side away from the light modulating layer 15. In the present embodiment, the antenna coil 2 is disposed on the side of the second substrate 12 away from the light modulating layer 15; however, the present disclosure is not limited thereto. In another embodiment, the antenna coil 2 may be disposed on the first substrate 11, and located at the side of the first substrate 11 away from the light modulating layer 15.

Figure 2:
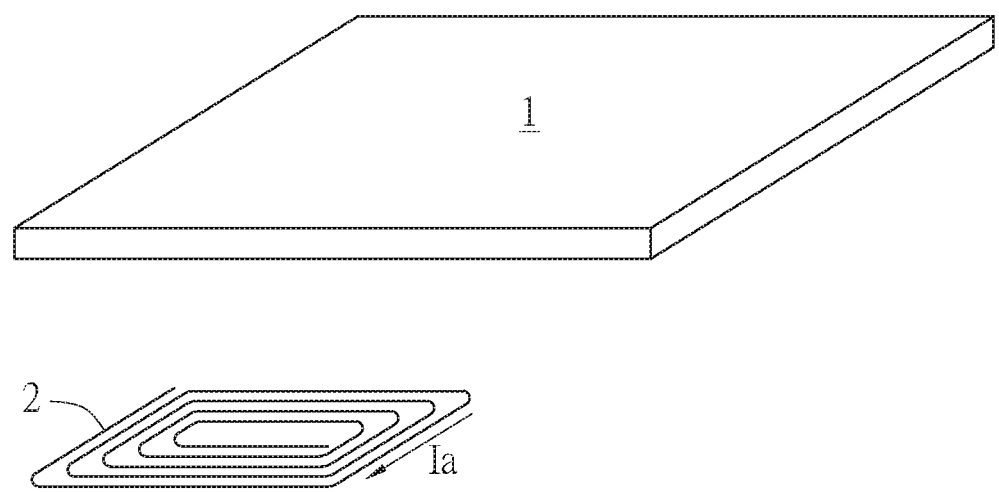
FIG. 2 is an exploded view of the display device in the first embodiment of the present disclosure.
Figure 3A:
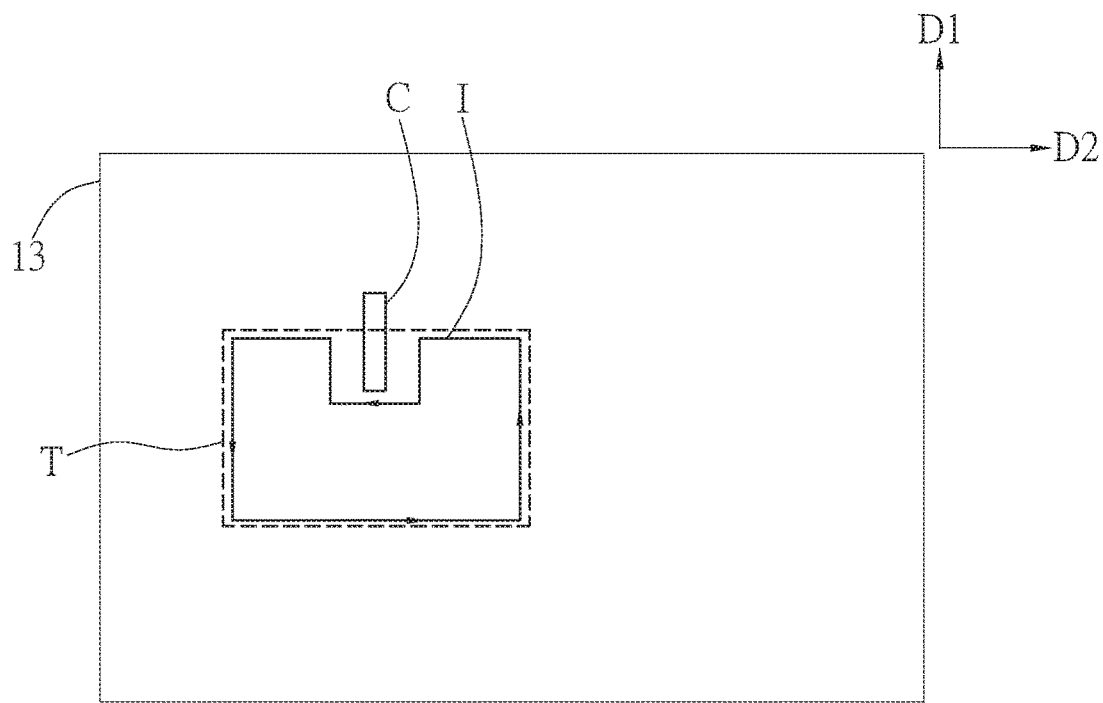
FIG. 3A is a top view of the common electrode layer in the first embodiment of the present disclosure.
Figure 3B:
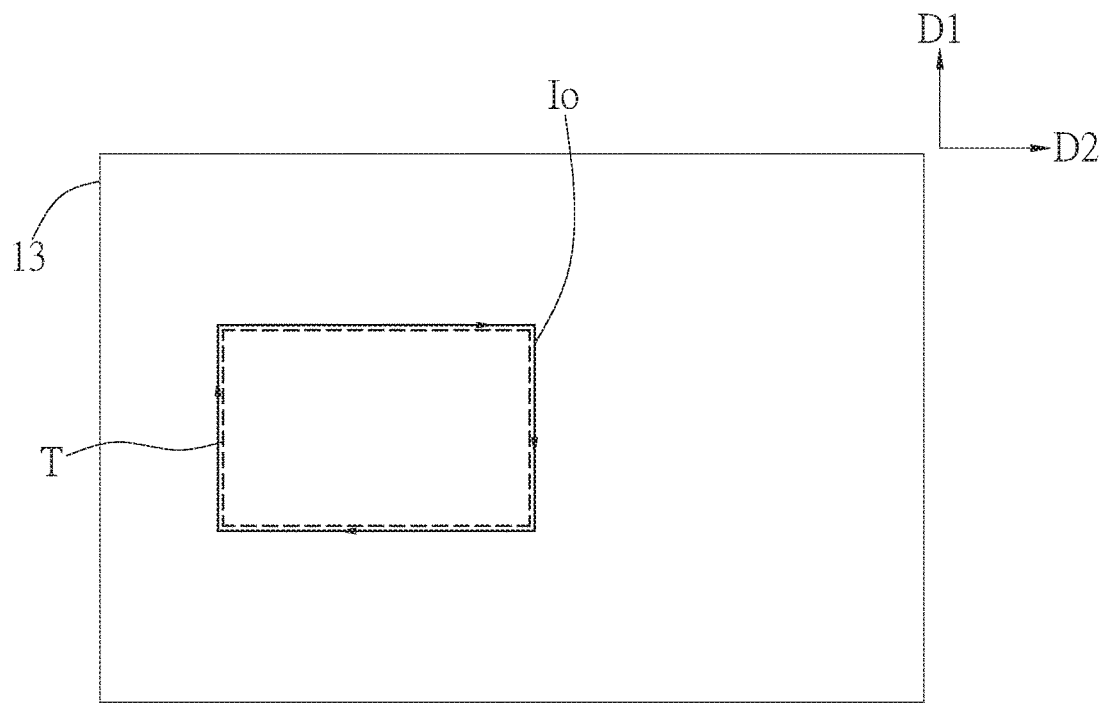
FIG. 3B is a diagram of a comparative embodiment of FIG. 3A.

Please refer to FIG. 2, FIG. 3A, and FIG. 3B. FIG. 3A is an embodiment of the present disclosure, and FIG. 3B is a comparative embodiment of FIG. 3A. As shown in FIG. 3A, in the present embodiment, an orthogonal projection of the antenna coil 2 on the common electrode layer 13 defines a contour T; that is, the contour of the orthogonal projection of the antenna coil 2 on the common electrode layer 13 is the contour T as shown in FIG. 3A. And the common electrode layer 13 is discontinuous along at least one portion of the contour T. In particular, as shown in FIG. 2, the antenna coil 2 will generate variation of magnetic flux when the antenna coil 2 receives and emits signals to generate a current Ia at operating frequency. And since the common electrode layer 13 is a conductor, according to the law of electromagnetic induction, the common electrode layer 13 will also generate variation of magnetic flux and an induced current Io along the contour T whose direction is opposite to that of the current Ia, as shown in FIG. 3B. In the present embodiment, a cutting line C is formed on the common electrode layer 13 along the contour T to reduce the induced electromotive force generated by the induced current I, making the common electrode layer 13 discontinuous along at least one portion of the contour T so that the circuit of the induced current I is varied. The aforementioned discontinuity means something such as a gap that runs from the top surface to the bottom surface of the common electrode layer 13 so that the common electrode layer 13 would not be conductive at the location of discontinuity. In the present embodiment, the ways of forming the cutting line C may be making a cut with a width in an intact and continuous common electrode layer 13 using laser, or leaving a gap in advance when producing the common electrode layer 13. However, the present disclosure doesn't limit the modalities and ways of forming the cutting line C. In addition, other ways of blocking may be used to achieve the aforementioned discontinuous structure.

Please refer to FIG. 3A and FIG. 3B. Since the common electrode layer 13 in FIG. 3B is intact and has no cutting line, when the antenna coil 2 has a current Ia, an induced current Io will be induced in the common electrode layer 13, forming a circuit along the antenna contour T. Comparing FIG. 3A to FIG. 3B, it is clear that when the cutting line C is formed on the common electrode layer 13 along the contour T so that the common electrode layer 13 has at least one portion that is discontinuous in the contour T, the range that the circuit of the induced current may be formed in the area surrounded by the contour T will be reduced. Since the induced electromotive force is the same size but in the opposite direction with the variance of the magnetic flux according to Lenz's law, the range in which an induced current I may be formed in the common electrode layer 13 in FIG. 3A is smaller than the range of the induced current Io in FIG. 3B, meaning that the induced electromotive force in FIG. 3A is smaller than the induced electromotive force in FIG. 3B. Thus, the present disclosure may achieve the purpose of reducing the influence of the induced electromotive force on the signal reception and transmission of the antenna coil 2 by reducing the induced electromotive force.

Figure 4:
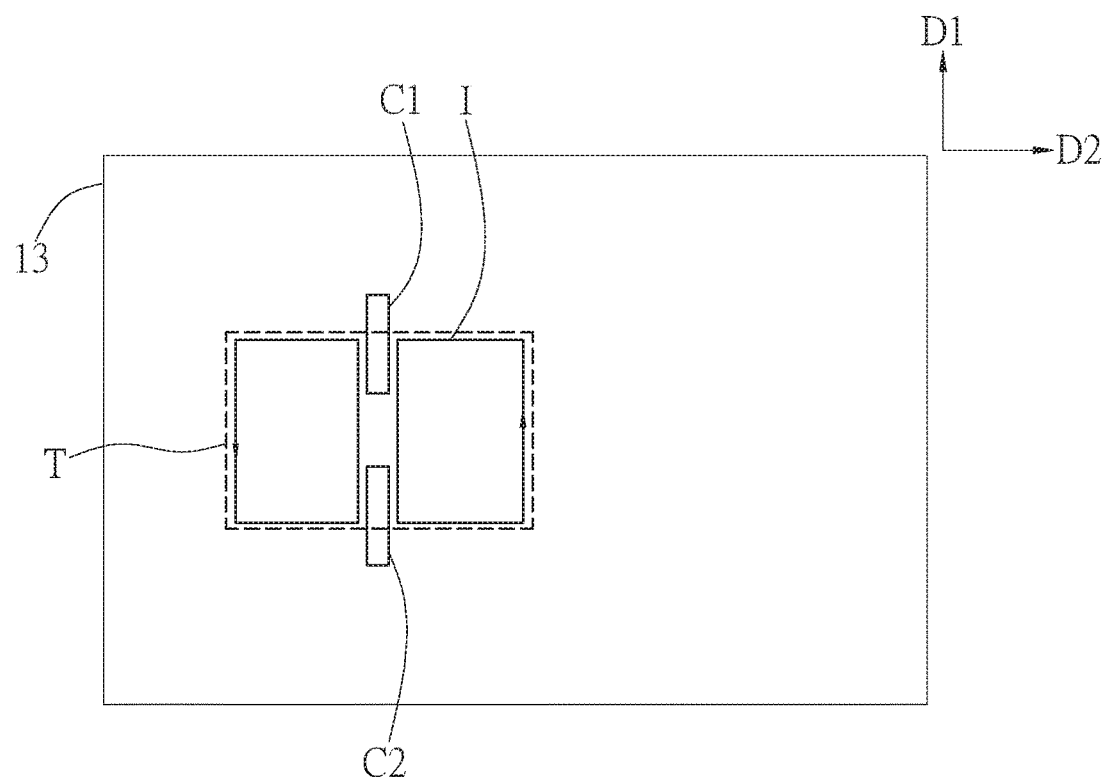
FIG. 4 is a top view of the common electrode layer in a variation of the first embodiment of the present disclosure.

Please refer to FIG. 4, illustrating a variation of the common electrode layer 13 in the present embodiment. The difference between the embodiment illustrated in FIG. 4 and that illustrated in FIG. 3 is as follows: In FIG. 4, two cutting lines (C1 and C2) are formed on the common electrode layer 13 so that the common electrode layer 13 is discontinuous along at least one portion of each of the two opposite sides with respect to the contour T so that the common electrode layer 13 generates the induced current I by regions. In the present embodiment, by making two cutting lines (C1 and C2) in their respective locations, the area within the contour T where an induced current I may be induced is divided into a plurality of regions, making the range surrounded by the induced current I smaller and in turn reducing the induced electromotive force.

Figure 5:
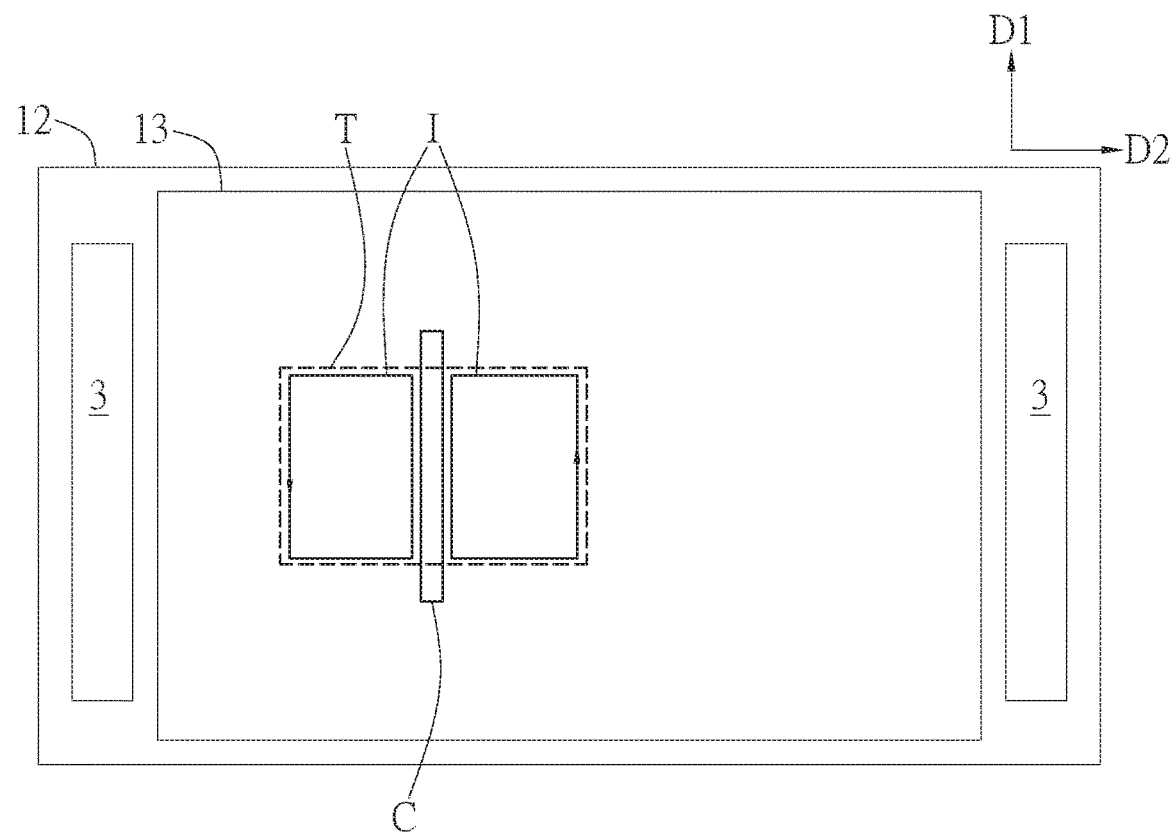
FIG. 5 is a top view of the display device of the first embodiment of the present disclosure.

FIG. 5 illustrates another display device Z provided by the present embodiment. Please refer to FIG. 5, wherein the embodiment of the common electrode layer 13 illustrated is similar to the embodiment in FIG. 4. The differences are as follows: In the embodiment of FIG. 5, the cutting line C extends along a first direction D1 to pass through the area surrounded by the contour T on the common electrode layer 13 so that the common electrode layer 13 includes two separated areas along the first direction D1 in the range surrounded by the contour T. Specifically, when the distance between the two cutting lines (C1, and C2) in FIG. 4 is greater, circuits may be generated between the two cutting lines (C1, and C2). Thus, compared to FIG. 4, the embodiment in FIG. 5 further ensures that the induced current I will be divided into even smaller circuits.

In addition, in the embodiment of FIG. 5, next to the common electrode layer 13 are two gate driver modules 3, wherein each of the gate driver module 3 is respectively coupled to the display module 1 from two opposite sides extending along the first direction D1 so as to drive the display module 1. In the present embodiment, the embodiment of FIG. 5, the gate driver module 3 is disposed on the second substrate 12, and located at two opposite sides of the common electrode layer 13. However, the present disclosure is not limited thereto. For example, in another embodiment, the gate driver module 3 may be disposed outside of the display module 1 to be coupled to the display module, or disposed on the transistor layer 14. As such, the level of uneven brightness of display screen due to the common electrode layer 13 having the cutting line C in the first direction D1 is reduced. However, the present disclosure is also not limited thereto. It should be noted that FIG. 5 merely illustrate the second substrate 12, the common electrode layer 13, and the gate driver module 3 of the display device Z in the present embodiment. Other components are omitted for the convenience of description.

Figure 6:
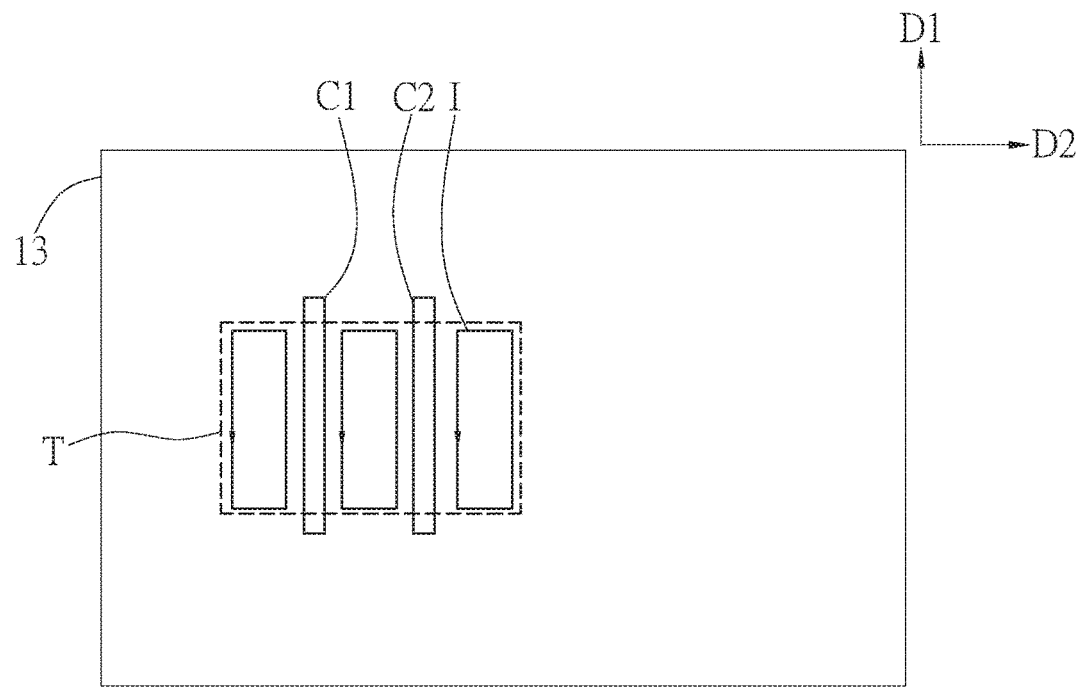
FIG. 6 is a diagram of the common electrode layer in a variation of the first embodiment of the present disclosure.

Please refer to FIG. 6, illustrating another embodiment of the common electrode layer 13 in the first embodiment. The main difference between FIG. 6 and FIG. 5 in the embodiments of the common electrode layer 13 is the number of cutting lines. In FIG. 6, the common electrode layer 13 has two cutting lines (C1 and C2) passing through the area surrounded by the contour T so that the induced current I may be separated into three smaller circuits than that in the abovementioned embodiments. Thus, the induced electromotive force may be further reduced. It should be noted that, the present disclosure is not intended to limit the number of cutting lines. As long as the common electrode layer 13 is discontinuous along at least one portion of the contour T, it is within the scope of the present disclosure.

Figure 7:
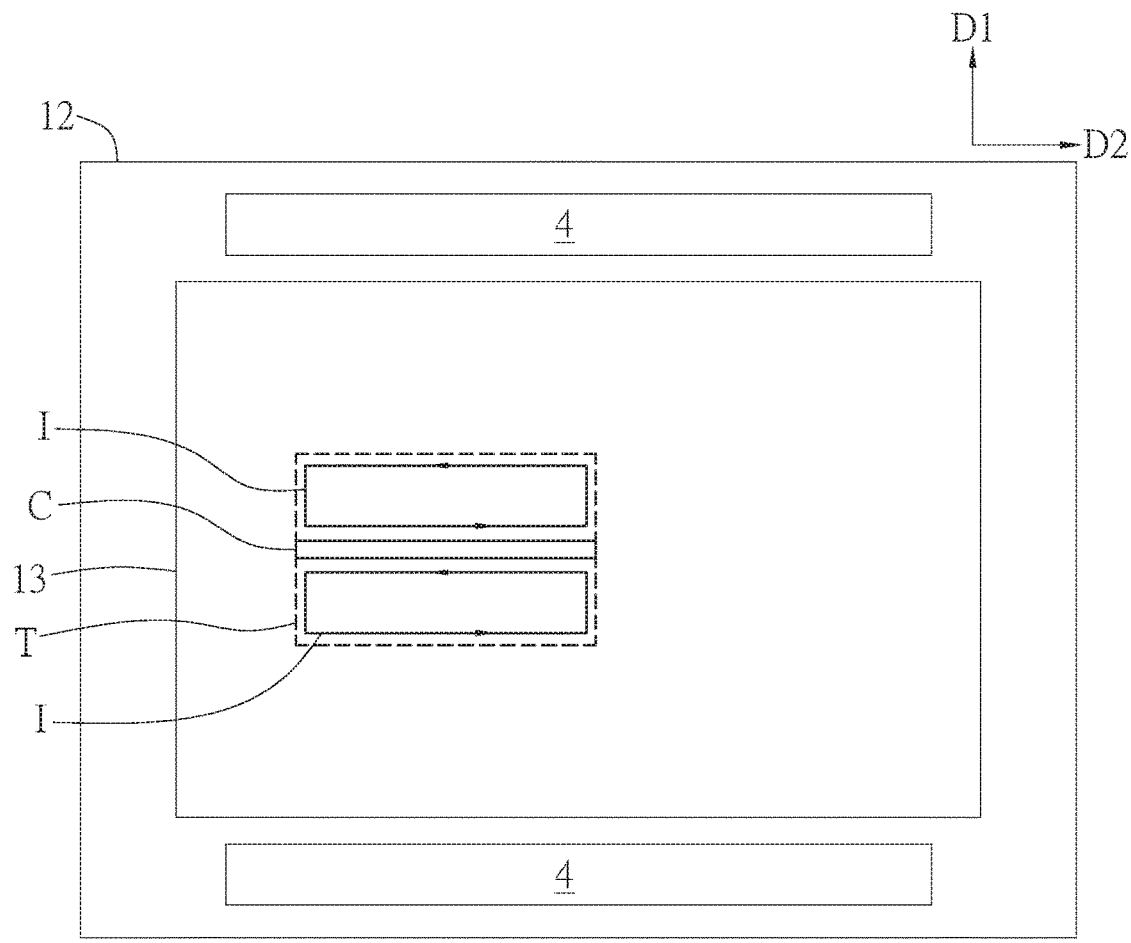
FIG. 7 is a top view of the display device in the first embodiment of the present disclosure.
Figure 8:
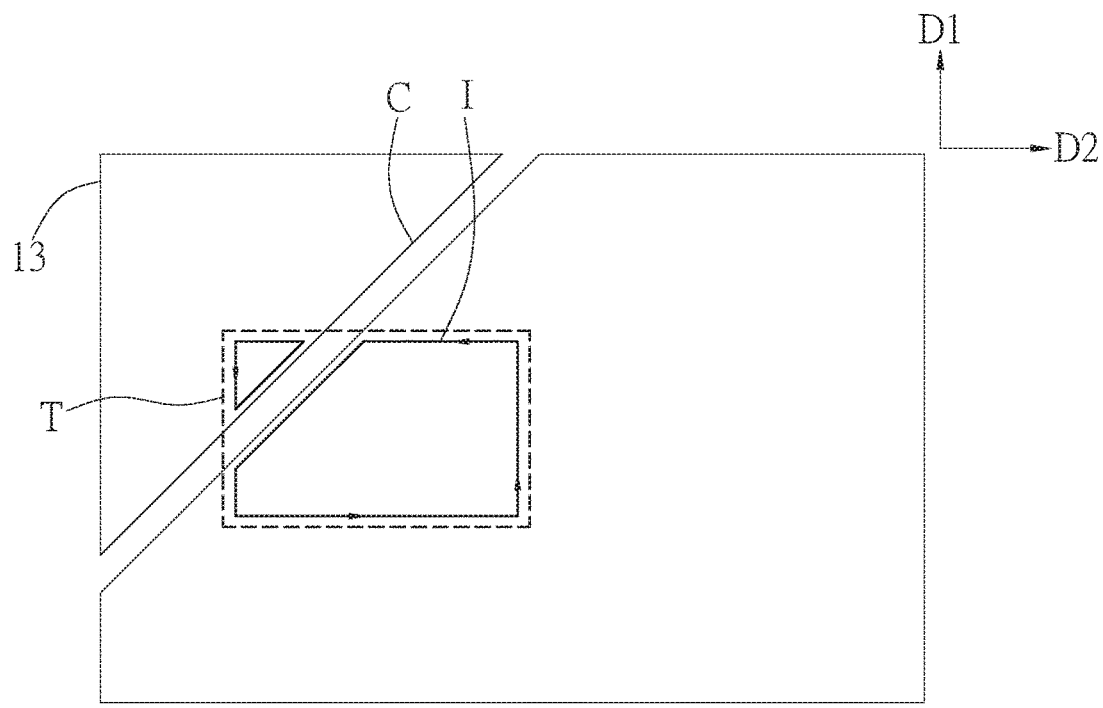
FIG. 8 is a top view of the common electrode layer in the first embodiment of the present disclosure.

In the abovementioned embodiments, the cutting lines (C, C1, and C2) are implemented along the first direction to make the common electrode layer 13 discontinuous in the contour T. However, the present disclosure is not limited thereto. For example, in the embodiment as shown in FIG. 7, the cutting line C may be formed on the common electrode layer 13 extending along a direction D2 perpendicular to the first direction D1. Furthermore, as shown in FIG. 7, the illustrated common electrode layer 13 may have two source driver modules 4, However, the present disclosure is not limited thereto. Specifically, the display device in FIG. 7 has two source driver modules 4, respectively coupled to the display module 1 from the two opposite sides extending along the second direction D2 so as to drive the display module 1. In the embodiment in FIG. 7, the source driver modules 4 are disposed on the second substrate 12. However, the present disclosure is not limited thereto. In another embodiment, the source driver modules 4, for example, may be externally connected to the display module 1. Through the placing of source driver modules 4 on two sides of the common electrode layer 13 in FIG. 7, the level of uneven brightness of the display screen due to the common electrode layer 13 having the cutting line C extending along the second direction D2 may be reduced.

The abovementioned embodiments describe the cases where the cutting line C is formed on the common electrode layer 13 along the first direction D1 or the second direction D2, and the range for forming the cutting line C is limited to within the contour T or near the lines of the contour T. However, it should be noted that the present disclosure is not limited thereto. For example, as shown in the embodiment in FIG. 8, the cutting line C may be formed on the common electrode layer 13 passing through the contour T parallel to neither the first direction D1 nor the second direction D2, and the cutting line C may extend so that the common electrode layer 13 may be separated to be at least two separate portions. The embodiment in FIG. 8 may further prevent the induced current I being generated around the contour T, and restrict the induced current I to the two areas separated by the cutting line C and within the contour T. This is to ensure that the induced current I is smaller than the induced current without the cutting line C so that influence of the induced electromotive force on the antenna coil 2 is reduced.

Figure 9:
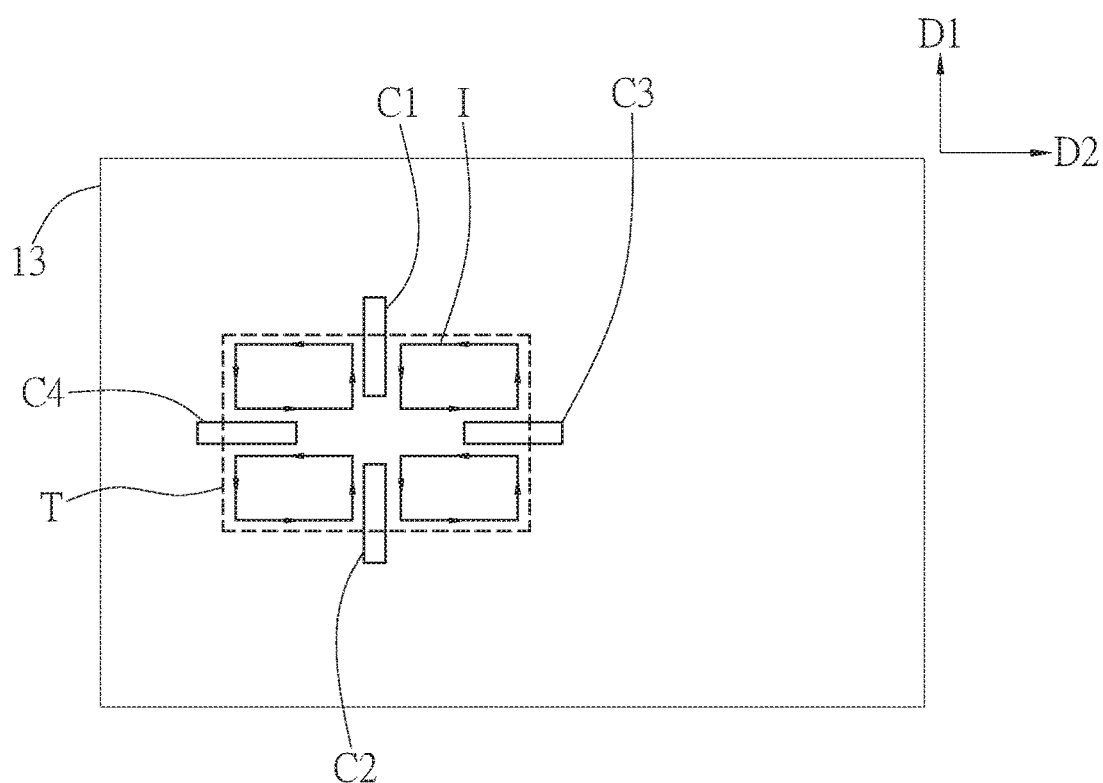
FIG. 9 is a top view of the common electrode layer of the first embodiment of the present disclosure.

It should be noted that, in addition to the cutting line C formed along the first direction D1 or the second direction D2 in another embodiment, the cutting lines C extending along two different directions may be combined. That is, as shown in FIG. 9, the cutting lines C along the first direction D1 and the second direction D2 are formed on the common electrode layer 13 at the same time. Furthermore, FIG. 9 includes the first cutting line C1 and the second cutting line C2 formed on the common electrode layer 13 along the first direction D1, and the third cutting line C3 and the forth cutting line C4 formed on the common electrode layer 13 along the second direction D2, wherein under this structure, the induced current generated in the common electrode layer 13 due to the variance of the magnetic flux may be separated to four smaller induced current circuits. Since the cutting lines in FIG. 9 (C1, C2, C3, and C4) cut the common electrode layer 13 into a plurality of common electrodes with small areas, it is equivalent to a plurality of common electrode layers 13, and therefore in a variation, the common electrode layer 13 in FIG. 9 may be disposed in a circuit in array (CIA) of the display area together with the gate circuit, wherein the source and the gate driver circuits are integrated in the transistor layer 14, and drive the pixel unit in the transistor layer 14 by regions. However, the present disclosure isn't limited thereto.

In summary, in the display device Z provided by the present embodiment, since the common electrode layer 13 is discontinuous along at least one portion in the contour T corresponding to the antenna coil 2, the current circuits of the induced current I in the contour T are varied. Through the abovementioned ways, the induced electromotive force in the present embodiment may be reduced so that the influence from the induced current I generated on the common electrode layer 13 on the antenna signal reception and transmission may be reduced.

In addition, in the present embodiment, the common electrode layer 13 is located between the second substrate 12 and the light modulating layer 15 so that the common electrode layer 13 is a coplanar with the pixel electrode in the transistor layer 14, providing a horizontal voltage to the light modulating layer 15. However, the present disclosure is not limited thereto. In another embodiment, the common electrode layer 13 may be disposed on the first substrate 11 and apply a vertical voltage commonly with the pixel electrode of the transistor layer 14 to the light modulating layer 15.

The Second Electrode

The display device Z in the second embodiment of the present disclosure is described in reference to FIG. 10A to FIG. 11B as follows. The main difference between the display device Z provided by the present embodiment and the abovementioned embodiment is as follows: In the present embodiment, a metal line of the transistor layer 14 is further disconnected in a corresponding range surrounded by the contour T so that the induced current in the transistor layer 14 is separated into one or more smaller current circuits.

Specifically, when the antenna coil 2 in FIG. 2 generates the current Ia, in addition to the common electrode layer 13 generating the induced current I whose direction is opposite to the current Ia in the display device Z, the transistor layer 14 will also generate an induced current since the transistor layer 14 has a circuit made of the metal line. The aforementioned metal line may include a gate line, a signal line, or a common line. In an embodiment, the antenna coil 2 may be a near field antenna coil. Since a near field antenna coil works at high frequency, and the resistance of a transistor is much smaller at high frequency as opposed to low frequency, the gate line and the signal line will be conductive, thus a current circuit is formed between the gate line and the signal line. In addition, the transistor layer 14 further includes a common line. The common line may be formed by a metal material composing the gate line (Metal 1) or a metal material composing the signal line (Metal 2), depending on the production of the different CIAs. When the common line is formed by the metal material of the gate line (Metal 1), the common line is arranged parallel to and interlaced with the gate line; when the common line is formed by the material of the signal line (Metal 2), the common line is arranged parallel to and interlaced with the signal line. Since the common line is connected to the common electrode layer, the common line and the common electrode layer may together form a circuit of induced current.

Figure 10A:
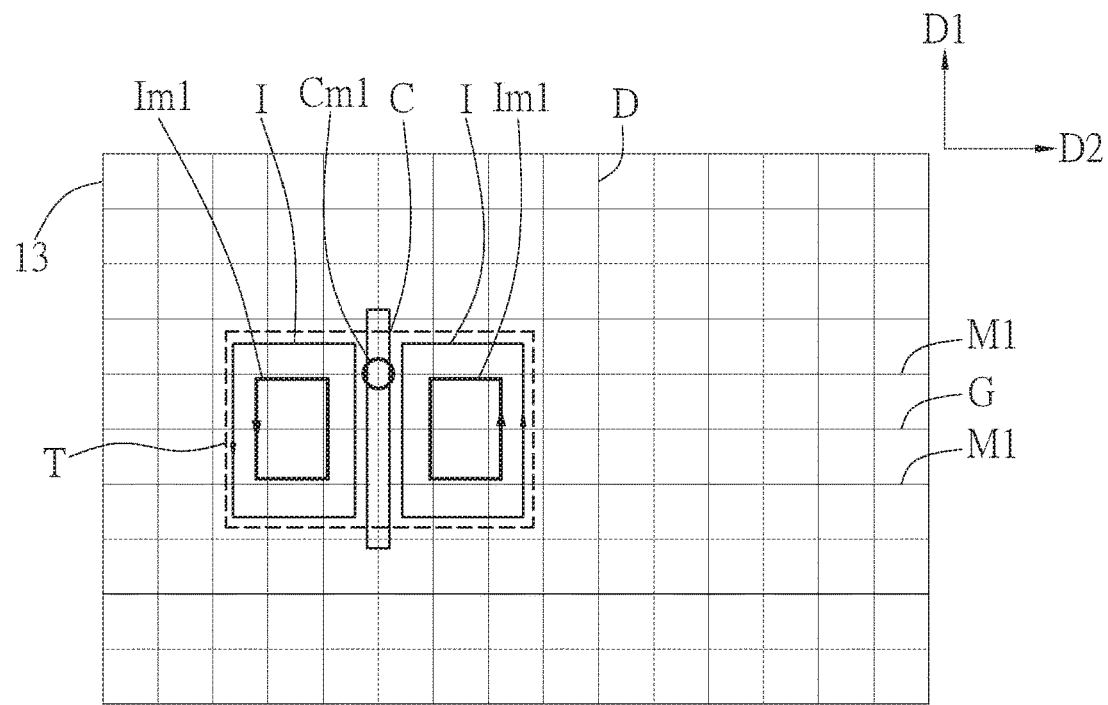
FIG. 10A is a top view of the common electrode layer in the second embodiment of the present disclosure.
Figure 10B:
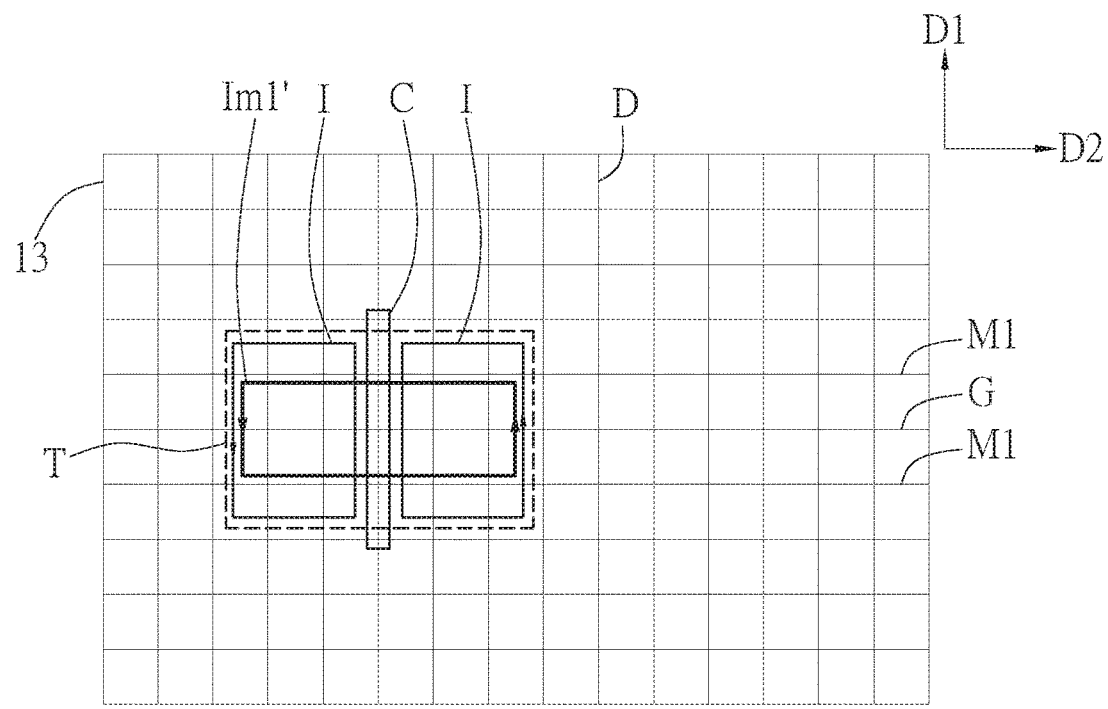

In particular, please refer to FIG. 10A and FIG. 10B. FIG. 10A illustrates orthogonal projections of signal lines D, orthogonal projections of gate lines G and orthogonal projections of common lines M1 on the common electrode layer 13. In the present embodiment, the cutting line C of the common electrode layer 13 is formed along the first direction D1. The material of the common lines M1 is the same as that of the gate lines G (Metal 1), and the common lines M1 are interlaced with the gate lines G; however, the present disclosure is not limited thereto. As shown in the FIGs, in the present embodiment, the gate lines G and the common lines M1 with the orthogonal projections passing through the contour T are disconnected in the range surrounded by the contour T so that circuits generating smaller induced current Im1 are formed. In the present embodiment, the cutting line Cm1 in the range surrounded by the contour T is formed in the transistor layer 12, and the cutting line Cm1 is parallel to the first direction D1 so that the target gate lines G and the target common lines M1 are disconnected. The cutting line Cm1 may be formed by laser or by leaving the space for the cutting Cm1 in advance during the production stage of the transistor layer 14; however, the present disclosure is not limited thereto. In addition, the gate lines G and the common lines M1 may also be disconnected by other ways, and not limited to disposing cutting lines.

Furthermore, please refer to the comparative embodiment in FIG. 10B, wherein the gate lines G and the common lines M1 with orthogonal projections passing through the contour T are not disconnected in the range surrounded by the contour T, and the cutting line C of the common electrode layer 13 in the present embodiment is formed along the first direction D1. In this situation, the common lines M1 and the common electrode layer 13 will form a circuit to allow the induced current Im1' to pass through, wherein the common lines M1 contribute the part of the circuit in the second direction D2, and the common electrode layer 13 contributes the part of the circuit in the first direction D1. Thus, comparing FIG. 10A to FIG. 10B, it is clear that in FIG. 10A, by cutting the gate lines G and the common lines M1 within the range surrounded by the contour T, the induced current Im1 may be separated into two smaller circuits. As such, the induced electromotive force generated by the transistor layer 14 in FIG. 10A may be smaller than the induced electromotive force generated by the transistor layer 14 in FIG. 10B.

Figure 10C:
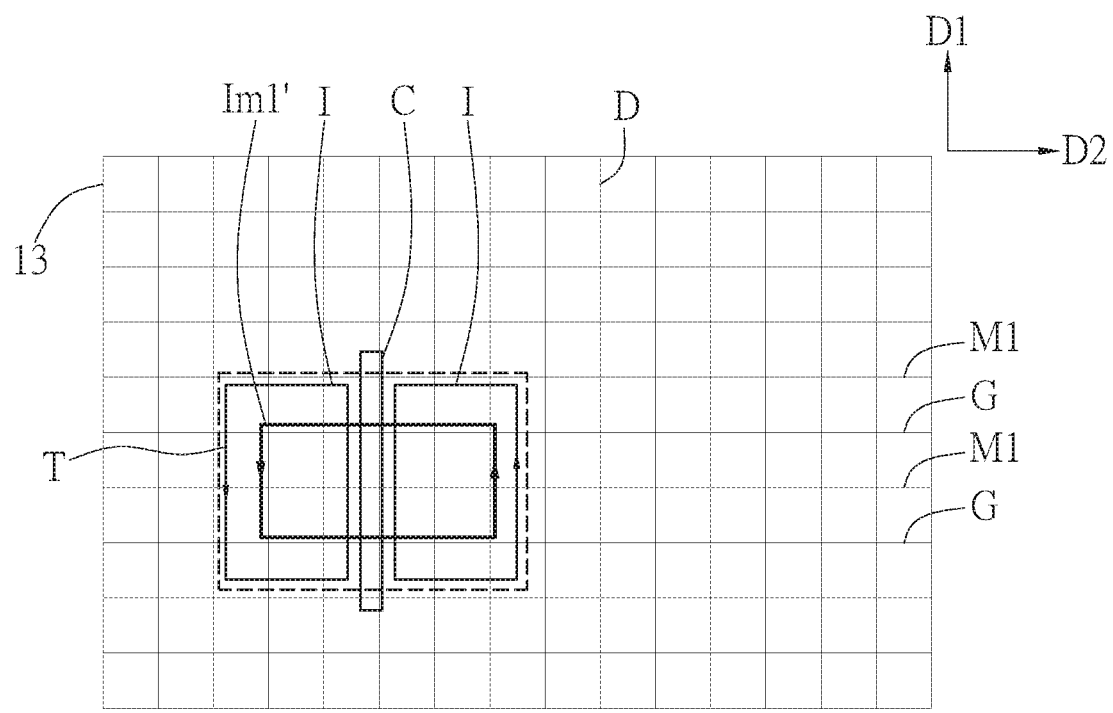

Please further refer to the comparative embodiment in FIG. 10C. In this comparative embodiment, the gate lines G and the common lines M1 are not disconnected in the corresponding range surrounded by the contour T. As shown in the Figure in the comparative embodiment, circuits of the induced current Im1' are formed by the gate lines G and the signal lines D, wherein the range of the circuits is larger than the range of the induced current I in FIG. 10A. Thus, comparing FIG. 10A to FIG. 10C, it is clear that, by cutting the gate lines G and the common lines M1 within the range corresponding to the contour T, the circuits range of the induced current I may be reduced and the induced electromotive force may be further reduced. It should be noted that, with respect to the comparative embodiment in FIG. 10B, simply cutting the two common lines M1 in the range surrounded by the contour T can achieve the effect appeared in FIG. 10A; with respect to the comparative embodiment in FIG. 10C, simply cutting the two gate lines G in the range surrounded by the contour T can achieve the effect appeared in FIG. 10A. In other words, in different embodiments, depending on the density of the metal lines within the range of the contour T, one can cut only the gate lines G, or only the common lines M1, or both the gate lines and the common lines, and not limited to the present embodiment.

Figure 11A:
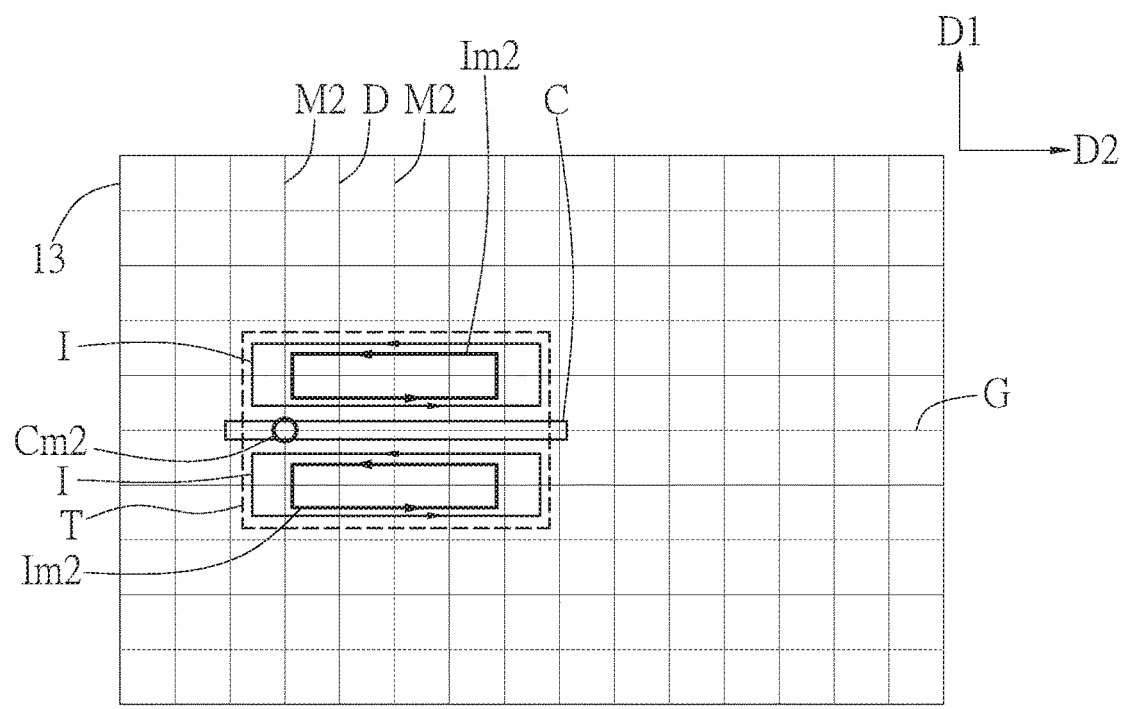
FIG. 11A is a top view of the common electrode layer in a variation of the second embodiment of the present disclosure.
Figure 11B:
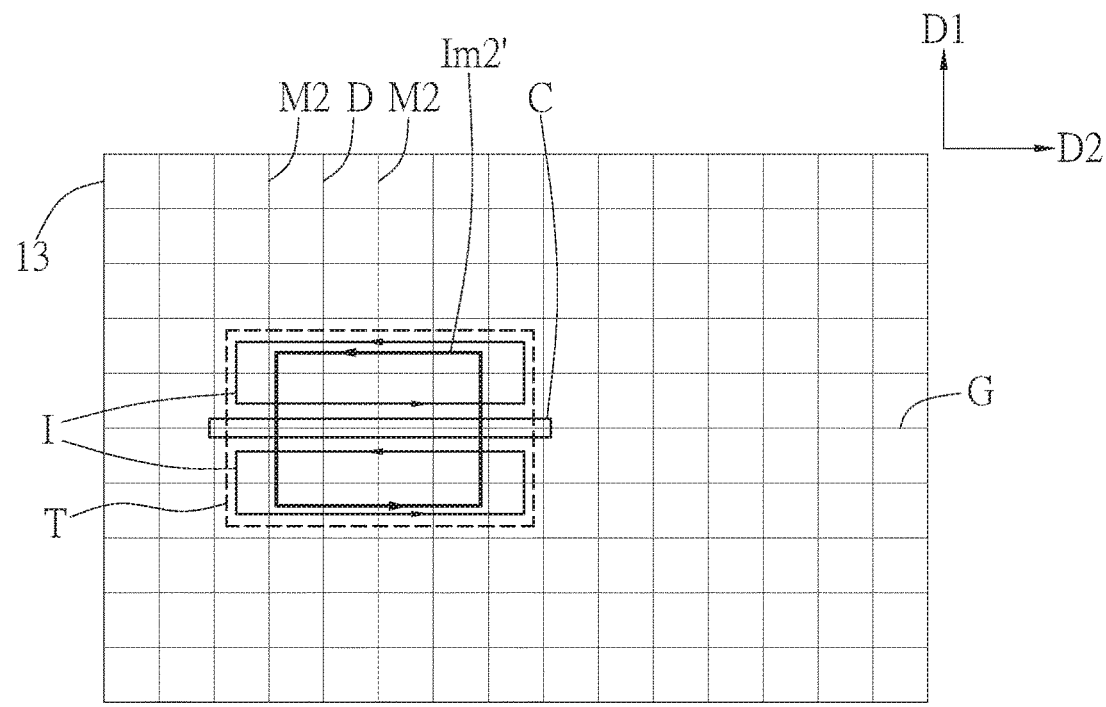
FIG. 11B is a diagram of a comparative embodiment of FIG. 11A.

Please refer to FIG. 11A and FIG. 11B. FIG. 11A illustrates a variation of the present embodiment, wherein the material of the common lines M2 is same as the material of the signal lines D (Metal 2), and the common lines M2 are interlaced with the signal lines D, and the present embodiment has the cutting line C in the common electrode layer 13 along the second direction D2. In FIG. 11A, the signal lines D and the common lines M2 in the corresponding range surrounded by the contour T are disconnected in the range surrounded by the contour T so that circuits with smaller induced current Im2 are generated. Similarly, in the present embodiment, the cutting line Cm2 in the range surrounded by the contour T is formed on the transistor layer 14, and the cutting line Cm2 is parallel to the second direction D2 so as to disconnect the target signal line D and the target common line M2. The cutting line Cm2 may be formed by laser or by leaving the space for the cutting Cm2 in advance during the production stage of the transistor layer 14; the present disclosure is not limited thereto.

Please refer to the comparative embodiment of FIG. 11B, wherein the signal lines D and the common lines M2 are not disconnected in the range surrounded by the contour T, and circuits of the induced current Im2' are formed by the common lines M2 and the common electrode layer 13, wherein the common lines M2 contribute the part of the circuits in the first direction D1, and the common electrode layer 13 contributes the part of the circuits in the second direction D2. Therefore, comparing FIG. 11A to FIG. 11B, it is clear that, disconnecting the common lines M2 and the signal lines D in FIG. 11A can effectively reduce the range of the induced current Im2. Thus, the induced electromotive force generated by the transistor layer 14 may be further reduced in the present embodiment.

It should be noted that since the signal lines D and the common lines M2 in the first direction D1 are disconnected in the embodiment in FIG. 11A, the technical method in FIG. 11A may be also applied to the cases where the induced current circuits are formed by the gate lines G and the signal lines D (such as the comparative embodiment in FIG. 10C). In addition, like the comparative embodiment in FIG. 10A, in a variation of the embodiment in FIG. 11A, one may cut only the signal line D, only the common line M2, or both of those lines based on the densities of the metal lines in the range surrounded by the contour T, but not limited to the present embodiment in FIG. 11A.

Compared to the first embodiment, in addition to reducing the induced electromotive force on the common electrode layer 13 by varying the circuits of the induced current I, the second embodiment of the present disclosure further reduced the induced electromotive force on the transistor layer 14 by disconnecting the gate lines G, the signal lines D and the common lines (M1, and M2) in the transistor layer 14 and varying the circuits of the induced currents (Im1, and Im2) on the transistor layer 14. In addition, in some embodiments, when induced current circuits are formed by the common lines (M1, and M2) and the common electrode layer 13 (the comparative embodiments of FIG. 10B and FIG. 11B), the induced current circuits and the induced voltage may be reduced by the technical method in the present embodiment.

In summary, in the embodiments of the present disclosure, through the technical method of "having at least one instance of discontinuity along the contour of the orthogonal projection of the antenna coil in the common electrode layer," the induced current circuits may be altered and the influence of the induced electromotive force generated by the display modules 1 on the antenna signal reception and transmission may be further reduced.

The abovementioned disclosure is only the preferred embodiments of the present disclosure, and is not intended to limit the scope of the present invention. All equivalents and alternations based on the specification and FIGs of the present disclosure are included in the scope of the present disclosure.

What is claimed is:

1. A display device, comprising:
    a display module including:
        a first substrate;
        a second substrate;
        a common electrode layer disposed between the first substrate and the second substrate;
        a TFT layer disposed on the second substrate; and
        a light modulating layer disposed between the first substrate and the second substrate; and
    an antenna coil disposed on a side of the first substrate or the second substrate away from the light modulating layer,
    wherein an orthogonal projection of the antenna coil on the common electrode layer defines a contour of the antenna coil, and the common electrode layer is discontinuous along at least one portion of the contour a plurality of signal lines disposed on the second substrate along a first direction and a plurality of gate lines disposed on the second substrate along a second direction, wherein at least one of the gate lines with orthogonal projections on the common electrode layer passing through the contour is disconnected in a corresponding range surrounded by the contour.

2. The display device according to claim 1, wherein the common electrode layer has at least two separated areas in a portion surrounded by the contour.

3. The display device according to claim 1, wherein the common electrode layer has at least two areas separated along a first direction in a portion surrounded by the contour, and the display device further has two gate driving modules respectively coupled to the display module from two opposite sides with respect to the first direction so as to drive the display module.

4. The display device according to claim 1, wherein the common electrode layer has at least two areas separated along a second direction in a portion surrounded by the contour, wherein the display device further has two source driving modules respectively coupled to the display module from two opposite sides with respect to the second direction so as to drive the display module.

5. The display device according to claim 1, further comprising a plurality of metal lines disposed on the second substrate along the second direction and connected to the common electrode layer, wherein at least one of the metal lines with orthogonal projections on the common electrode layer passing through the contour is disconnected in a corresponding range surrounded by the contour.

6. The display device according to claim 1, wherein the common electrode layer is disposed on the second substrate and is coplanar with the TFT layer.

7. The display device according to claim 1, wherein the common electrode layer is disposed between the first substrate and the light modulating layer.

* * * * *